United States Patent
Lee et al.

(10) Patent No.: US 12,058,915 B2
(45) Date of Patent: Aug. 6, 2024

(54) DISPLAY DEVICE HAVING LIGHT EMITTING PORTION AND LIGHT RECEIVING PORTION

(71) Applicant: LG Display Co., Ltd., Seoul (KR)

(72) Inventors: Shin-Bok Lee, Paju-si (KR); HoYoung Jeong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 217 days.

(21) Appl. No.: 17/125,543

(22) Filed: Dec. 17, 2020

(65) Prior Publication Data

US 2021/0202623 A1    Jul. 1, 2021

(30) Foreign Application Priority Data

Dec. 27, 2019 (KR) .................. 10-2019-0175882

(51) Int. Cl.
*G06F 3/042* (2006.01)
*H04N 23/57* (2023.01)
*H10K 59/12* (2023.01)
*H10K 59/65* (2023.01)

(52) U.S. Cl.
CPC ........... *H10K 59/65* (2023.02); *G06F 3/0421* (2013.01); *H04N 23/57* (2023.01); *H10K 59/12* (2023.02)

(58) Field of Classification Search
CPC ........... H01L 27/3234; H01L 27/3244; H01L 27/3225; H01L 27/3227; H01L 27/3253; H01L 51/05; G06F 3/0421; G06F 3/042–0428; H04N 5/2257; H05K 2201/10106; G09G 3/32; G09G 3/3225; G06V 40/1318
See application file for complete search history.

(56) References Cited

U.S. PATENT DOCUMENTS

2018/0190710 A1\* 7/2018 Ryu .................. H01L 25/167
2018/0212060 A1   7/2018 Kang et al.
2018/0364869 A1\* 12/2018 Lee .................. G06F 3/0421
2019/0272407 A1\* 9/2019 Park .................. G06V 40/1329
(Continued)

FOREIGN PATENT DOCUMENTS

KR       10-0936680 B1    1/2010
KR    10-2017-0096565 A    8/2017

OTHER PUBLICATIONS

Choi et al., Machine Translation of Foreign Patent Document KR 20170096565A, Electronic Apparatus, Aug. 24, 2017, pp. 1-83 (Year: 2017).\*

*Primary Examiner* — Roberto W Flores
(74) *Attorney, Agent, or Firm* — Birch, Stewart, Kolasch & Birch, LLP (57) ABSTRACT

Discussed is a display device in which an optical sensor can be easily provided on a display panel without causing a decrease in area or a change in shape of an active area by forming a low-resolution area in a partial area of the active area of the display panel and by providing the optical sensor on a back surface of the display panel overlapping the low-resolution area. By providing a light source emitting light for gesture sensing or the like on a flexible printed circuit which is bonded to a non-active area, it is possible to curb an influence of light emitted from the light source on an image, to prevent an increase in area of the non-active area, and to realize a gesture sensing function of the display device.

20 Claims, 8 Drawing Sheets

(56) References Cited

U.S. PATENT DOCUMENTS

| | | | |
|---|---|---|---|
| 2021/0096643 A1* | 4/2021 | Park | H04N 5/2256 |
| 2021/0151517 A1* | 5/2021 | Zhu | H10K 50/852 |
| 2021/0216741 A1* | 7/2021 | Zhang | G06V 10/54 |

* cited by examiner

DISPLAY DEVICE HAVING LIGHT EMITTING PORTION AND LIGHT RECEIVING PORTION

CROSS REFERENCE TO RELATED APPLICATION

This application claims priority to Korean Patent Application No. 10-2019-0175882, filed in the Republic of Korea on Dec. 27, 2019, which is hereby incorporated by reference for all purposes as if fully set forth herein into the present application.

BACKGROUND

Field of the Invention

Embodiments of the present disclosure relate to a display device.

Discussion of the Related Art

With advancement in the information-oriented society, requirements for display devices that display an image have increased. Various types of display devices such as a liquid crystal display device and an organic light emitting display device have been used.

A display device includes a display panel in which a plurality of gate lines, a plurality of data lines, and a plurality of subpixels are arranged and various driving circuits that drive the gate lines, the data lines, and the like. The display panel includes an active area in which a plurality of subpixels are arranged and an image is displayed, and a non-active area which is located outside of the active area and in which signal lines and the like are arranged.

Depending on the type of a display device, the display device includes a camera sensor, a proximity sensor, or a gesture sensor (hereinafter also referred to as an "optical sensor") which is provided in the non-active area.

The display device can provide more various functions with such an optical sensor. When the optical sensor is provided in the non-active area of the display panel, an increase in area of the active area can be limited due to an increase in area of the non-active area. When the optical sensor is provided in the active area, the quality of images which are displayed through the active area can be affected.

Therefore, there is a demand for technology that can prevent or minimize a decrease of an active area and a decrease in the image quality in a display panel and for technology that can allow an optical sensor for realization of various sensing functions to be provided.

SUMMARY OF THE INVENTION

Embodiments of the present disclosure provide technology for preventing a decrease in quality of an image which is displayed in an active area of a display panel and for allowing an optical sensor to be provided in the display panel.

Embodiments of the present disclosure provide technology for minimizing a decrease in area of an active area of a display panel or an increase in area of a non-active area and for allowing an optical sensor to be provided in the display panel.

According to an aspect of the present disclosure, there is provided a display device comprising: a display panel that includes an active area in which a plurality of subpixels are arranged and a non-active area which is located outside of the active area; at least one flexible printed circuit of which a part is provided in the non-active area; at least one light emitting portion that is provided on the flexible printed circuit; and at least one light receiving portion that is located on a back surface of the display panel and is provided in an area overlapping the active area.

Here the light emitting portion can include a light source that is attached onto the flexible printed circuit, and a protective member that is provided on the light source and has a convex shape.

The active area of the display panel can include a first area with a first resolution and a second area with a second resolution which is lower than the first resolution. The at least one light receiving portion can be located in an area overlapping the second area.

According to another aspect of the present disclosure, there is provided a display device comprising: a substrate that includes an active area and a non-active area which is located outside of the active area; a plurality of light emitting elements that are arranged in the active area on the substrate; at least one light emitting portion that is provided on a flexible printed circuit bonded to the non-active area of the substrate and emits light of a wavelength different from a wavelength of light emitted from the light emitting elements; and at least one light receiving portion that is located in an area other than an area overlapping the at least one light emitting portion.

According to another aspect of the present disclosure, there is provided a display device comprising: a display panel that includes an active area in which a plurality of subpixels are arranged and a non-active area which is located outside of the active area; a first area includes in the active area and having a first resolution; a second area included in the active area and having a second resolution which is lower than the first resolution; and at least one optical sensor located on a back surface of the display panel and overlapped with the second area.

According to the embodiments of the present disclosure, by providing the light emitting portion of the optical sensor in the non-active area and providing the light receiving portion of the optical sensor in a low-resolution area of the active area, it is possible to minimize an influence of driving of the optical sensor on display driving and to provide the optical sensor on the display panel.

According to the embodiments of the present disclosure, by providing the light emitting portion of the optical sensor on the flexible printed circuit which is bonded to the non-active area of the display panel, it is possible to minimize an increase in area of the non-active area and to provide the optical sensor on the display panel.

DETAILED DESCRIPTION OF THE EMBODIMENTS

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another.

Further, in the following description of examples or embodiments of the present disclosure, detailed descriptions of well-known functions and components incorporated herein will be omitted when it is determined that the description can make the subject matter in some embodiments of the present disclosure rather unclear. The terms such as "including," "having," "containing," "constituting," "make up of," and "formed of" used herein are generally intended to allow other components to be added unless the terms are used with the term "only." As used herein, singular forms are intended to include plural forms unless the context clearly indicates otherwise.

Terms such as "first," "second," "A," "B," "(A)," and "(B)" can be used herein to describe elements of the present disclosure. Each of these terms is not used to define essence, order, sequence, or number of elements etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc. each other via a fourth element. Here, the second element can be included in at least one of two or more elements that "are connected or coupled to," "contact or overlap," etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can."

Figure 1:
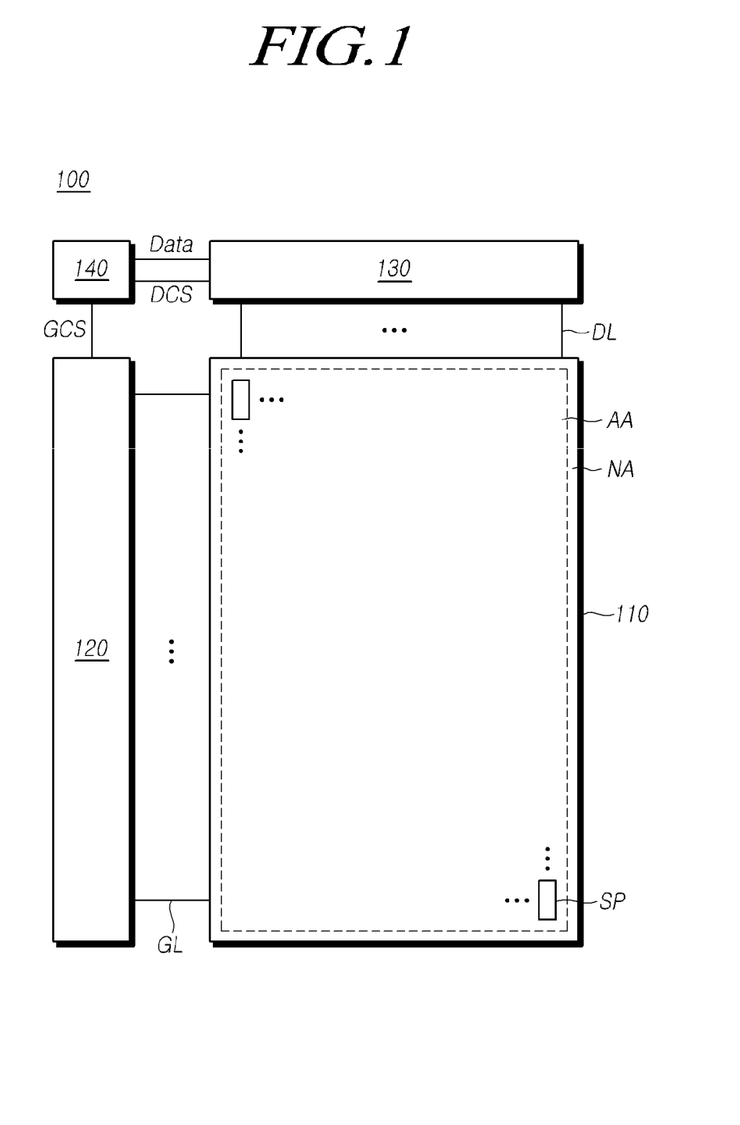
FIG. 1 is a diagram schematically illustrating a configuration of a display device according to embodiments of the present disclosure.

FIG. 1 is a diagram schematically illustrating a configuration of a display device 100 according to embodiments of the present disclosure. All the components of the display device according to all embodiments of the present disclosure are operatively coupled and configured.

Referring to FIG. 1, the display device 100 according to the embodiments of the present disclosure includes a display panel 110 in which a plurality of subpixels SP are arranged, and a gate driving circuit 120, a data driving circuit 130, and a controller 140 for driving the display panel 110.

The display panel 110 includes an active area AA in which the plurality of subpixels SP are arranged and that displays an image and a non-active area NA that is located outside of the active area AA and in which signal lines and the like are arranged.

A plurality of gate lines GL and a plurality of data lines DL are arranged in the active area AA of the display panel 110, and the subpixels SP are arranged in areas in which the gate lines GL and the data lines DL cross each other.

Each subpixel SP includes a light emitting element ED, and two or more subpixels SP can constitute a pixel.

The gate driving circuit 120 is controlled by the controller 140, and controls driving timings of the plurality of subpixels SP by sequentially outputting a scan signal to the plurality of gate lines GL provided in the display panel 110.

The gate driving circuit 120 includes one or more gate driver integrated circuits (GDICs), and can be provided on only one side of the display panel 110 or on both sides of the display panel 110 depending on a driving type.

The data driving circuit 130 receives image data from the controller 140 and converts the image data into a data voltage Vdata of an analog type. At timings at which a scan signal is applied via the gate lines GL, the data driving circuit 130 outputs the data voltage Vdata to the data lines DL to allow the subpixels SP to express brightness corresponding to the image data.

The data driving circuit 130 includes one or more source driver integrated circuits (SDICs).

The controller 140 supplies various control signals to the gate driving circuit 120 and the data driving circuit 130 to control the operations of the gate driving circuit 120 and the data driving circuit 130.

The controller 140 causes the gate driving circuit 120 to output a scan signal at timings which are realized in each frame, and converts image data received from the outside into a data signal which is used for the data driving circuit 130, and outputs the converted image data to the data driving circuit 130.

The controller 140 receives various timing signals including a vertical synchronization signal Vsync, a horizontal synchronization signal Hsync, an input data enable signal DE, and a clock signal CLK in addition to image data from the outside (for example, a host system).

The controller 140 generates various control signals using various timing signals received from the outside and outputs the generated control signals to the gate driving circuit 120 and the data driving circuit 130.

For example, the controller 140 outputs various gate control signals GCS including a gate start pulse GSP, a gate shift clock GSC, and a gate output enable signal GOE in order to control the gate driving circuit 120.

Here, the gate start pulse GSP controls an operation start timing of one or more gate driver integrated circuits (GDICs) of the gate driving circuit 120. The gate shift clock GSC is a clock signal which is input commonly to the one or more gate driver integrated circuits (GDICs), and controls a shift timing of a scan signal. The gate output enable signal GOE designates timing information of the one or more gate driver integrated circuits (GDICs).

The controller 140 outputs various data control signals DCS including a source start pulse SSP, a source sampling clock SSC, and a source output enable signal SOE in order to control the data driving circuit 130.

Here, the source start pulse SSP controls a data sampling start timing of one or more source driver integrated circuits (SDICs) of the data driving circuit 130. The source sampling clock SSC is a clock signal for controlling sampling timings of data in the one or more source driver integrated circuits (SDICs). The source output enable signal SOE controls an output timing of the data driving circuit 130.

The display device 100 can further include a power source management integrated circuit that supplies various voltages or currents to the display panel 110, the gate driving circuit 120, the data driving circuit 130, and the like or controls various voltages or currents which are to be supplied.

In the display panel 110, voltage lines for supplying various signals or voltages and the like are arranged in addition to the gate lines GL and the data lines DL. In each subpixel SP, a light emitting element ED and a circuit element such as a thin-film transistor for driving the light emitting element ED are arranged.

Figure 2:
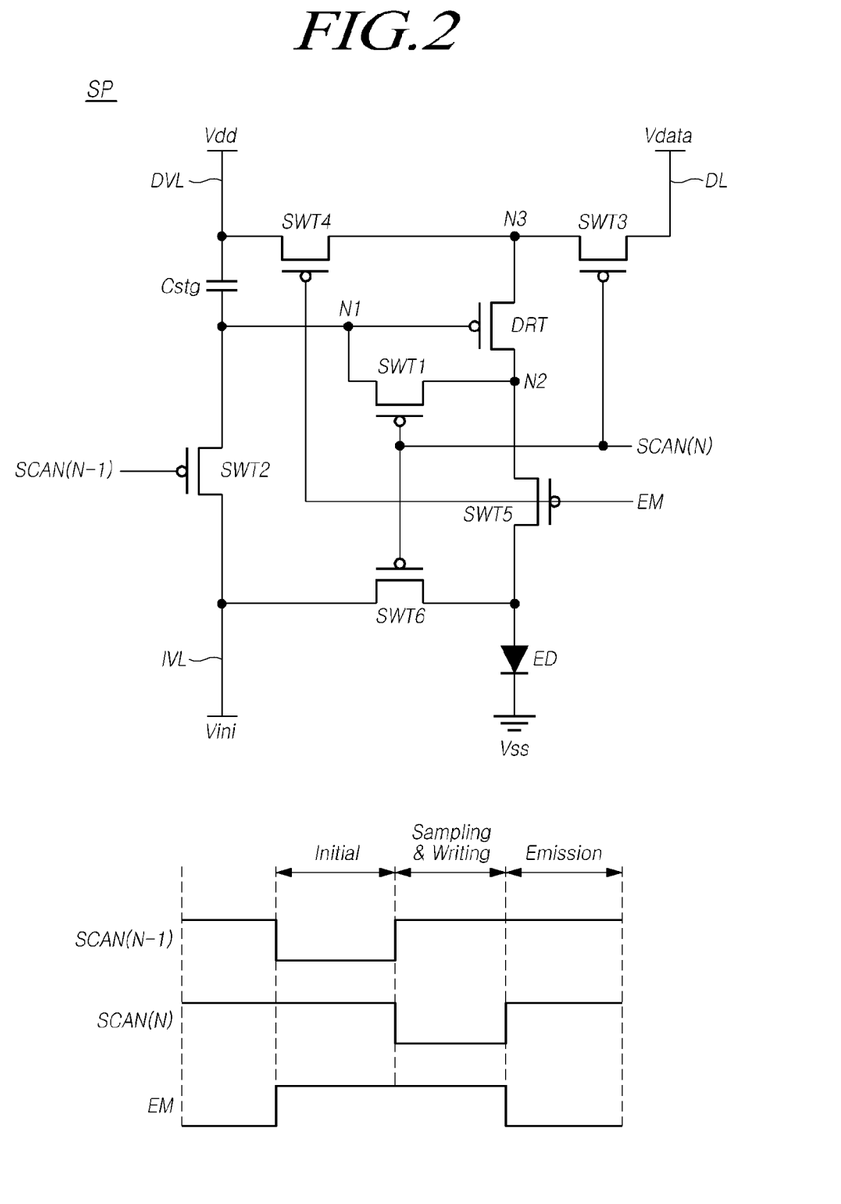
FIG. 2 is a diagram illustrating an example of a circuit structure and a driving timing of a subpixel which is included in the display device according to embodiments of the present disclosure.

FIG. 2 is a diagram illustrating an example of a circuit structure and a driving timing of a subpixel SP which is included in the display device 100 according to embodiments of the present disclosure. For example, the circuit structure and operation of the subpixel SP of FIG. 2 can be used in at least one or each of the plurality of subpixels SP of the display device 100.

Referring to FIG. 2, a light emitting element ED is provided in each subpixel SP arranged in the display panel 110, and a driving transistor DRT that drives the light emitting element ED by controlling a current flowing in the light emitting element ED is provided therein.

The light emitting element ED provided in the subpixel SP can be an organic light emitting diode OLED, or can be a light emitting diode LED or a micro light emitting diode μLED. Alternatively, the light emitting element ED can be a light emitting element ED including quantum dots.

One or more thin-film transistors in addition to the driving transistor DRT can be provided in each subpixel SP. For example, a storage capacitor Cstg for holding a voltage of the gate node of the driving transistor DRT for one frame can be provided.

FIG. 2 illustrates a 7T-1C structure in which seven thin-film transistors including the driving transistor DRT and one storage capacitor Cstg are provided in each subpixel SP, but the structure of each subpixel SP included in the display device 100 according to embodiments of the present disclosure is not limited thereto. In FIG. 2, each subpixel SP includes a PMOS thin-film transistor, but at least a part of the thin-film transistors provided in each subpixel SP can be of an NMOS type.

A light emitting element ED includes an anode electrode that is electrically connected to the driving transistor DRT and a cathode electrode that is supplied with a base voltage Vss.

The driving transistor DRT is electrically connected between a driving voltage line DVL to which a driving voltage Vdd is applied and the light emitting element ED. The driving transistor DRT is electrically connected to one data line DL to which a data voltage Vdata is applied. The gate node of the driving transistor DRT is electrically connected to the storage capacitor Cstg and an initial voltage line IVL.

A first switching transistor SWT1 is controlled by a scan signal SCAN(N) and is electrically connected between a first node N1 and a second node N2 of the driving transistor DRT. The first switching transistor SWT1 performs control such that a voltage obtained by compensating for a threshold voltage Vth of the driving transistor DRT using the data voltage Vdata is applied to the gate node.

A second switching transistor SWT2 is controlled by a scan signal SCAN(N-1) and is electrically connected between the first node N1 of the driving transistor DRT and the initialization voltage line IVL. The second switching transistor SWT2 is used to initialize the voltage of the gate node of the driving transistor DRT.

A third switching transistor SWT3 is controlled by the scan signal SCAN(N) and is electrically connected between a third node N3 of the driving transistor DRT and the data line DL. A fourth switching transistor SWT4 is controlled by a scan signal EM and is electrically connected between the third node N3 of the driving transistor DRT and the driving voltage line DVL.

A fifth switching transistor SWT5 is controlled by the scan signal EM and is electrically connected between the second node N2 of the driving transistor DRT and the light emitting diode ED. The fifth switching transistor SWT5 controls an emission timing of the light emitting diode ED.

A sixth switching transistor SWT6 is controlled by the scan signal SCAN(N) and is electrically connected between the anode electrode of the light emitting element ED and the initialization voltage line IVL. The sixth switching transistor SWT6 is used for initialization of the anode electrode of the light emitting element ED.

Regarding a driving method of such a subpixel SP, one subpixel SP is divisionally driven in an initialization period, a data writing period, and an emission period for one image frame period.

In the initialization period, a scan signal SCAN(N-1) of a low level is supplied to the subpixel SP and the second switching transistor SWT2 is turned on. When the second switching transistor SWT2 is turned on, the initialization voltage *Vini* is applied to the gate node of the driving transistor DRT.

When initialization is completed, a scan signal SCAN(N-1) of a high level and a scan signal SCAN(N) of a low level are supplied to the subpixel SP in the data writing period. Then, the second switching transistor SWT2 is turned off. The first switching transistor SWT1, the third switching transistor SWT3, and the sixth switching transistor SWT6 are turned on.

Since the first switching transistor SWT1 is turned on, the first node N1 and the second node N2 of the driving transistor DRT are electrically connected to each other.

Since the third switching transistor SWT3 is turned on, a data voltage Vdata is applied to the first node N1 which is the gate node of the driving transistor DRT via the driving transistor DRT and the first switching transistor SWT1. At this time, a voltage obtained by reflecting the threshold voltage Vth of the driving transistor DRT in the data voltage Vdata is applied to the gate node of the driving transistor DRT to compensate for the threshold voltage Vth of the driving transistor DRT.

Since the sixth switching transistor SWT6 is turned on in the data writing period, the anode electrode of the light emitting element ED is initialized by the initialization voltage Vini. That is, in the data writing period, application of a voltage to the gate node of the driving transistor DRT and initialization of the anode electrode of the light emitting element ED can be simultaneously performed.

In the emission period, a scan signal SCAN(N-1) of a high level and a scan signal SCAN(N) of a high level are supplied to the subpixel SP and a scan signal EM of a low level is supplied thereto. Accordingly, the first switching transistor SWT1, the third switching transistor SWT3, and the sixth switching transistor SWT6 are turned off, and the fourth switching transistor SWT4 and the fifth switching transistor SWT5 are turned on.

When the fourth switching transistor SWT4 is turned on, a driving voltage Vdd is supplied to the third node N3 of the driving transistor DRT. Then, a voltage difference based on the data voltage Vdata and the driving voltage Vdd is formed between the first node N1 and the third node N3 of the driving transistor DRT, and a current based on the data voltage Vdata flows through the driving transistor DRT.

When the fifth switching transistor SWT5 is turned on, the current based on the data voltage Vdata is supplied to the light emitting element ED, and the light emitting element ED can express brightness corresponding to the data voltage Vdata.

Such subpixels SP are arranged at constant intervals in the active area AA of the display panel 110 or the same number of subpixels SP are arranged in each unit area such that the display panel 110 expresses a uniform resolution.

Alternatively, the subpixels SP can be arranged such that some areas of the active area AA have different resolutions. In this case, it is possible to increase transmittance of an area with a low resolution and to provide an optical sensor in the area with the increased area for performing sensing. That is, an area in which an image is displayed and the optical sensor is provided can be included in the active area AA.

Figure 3:
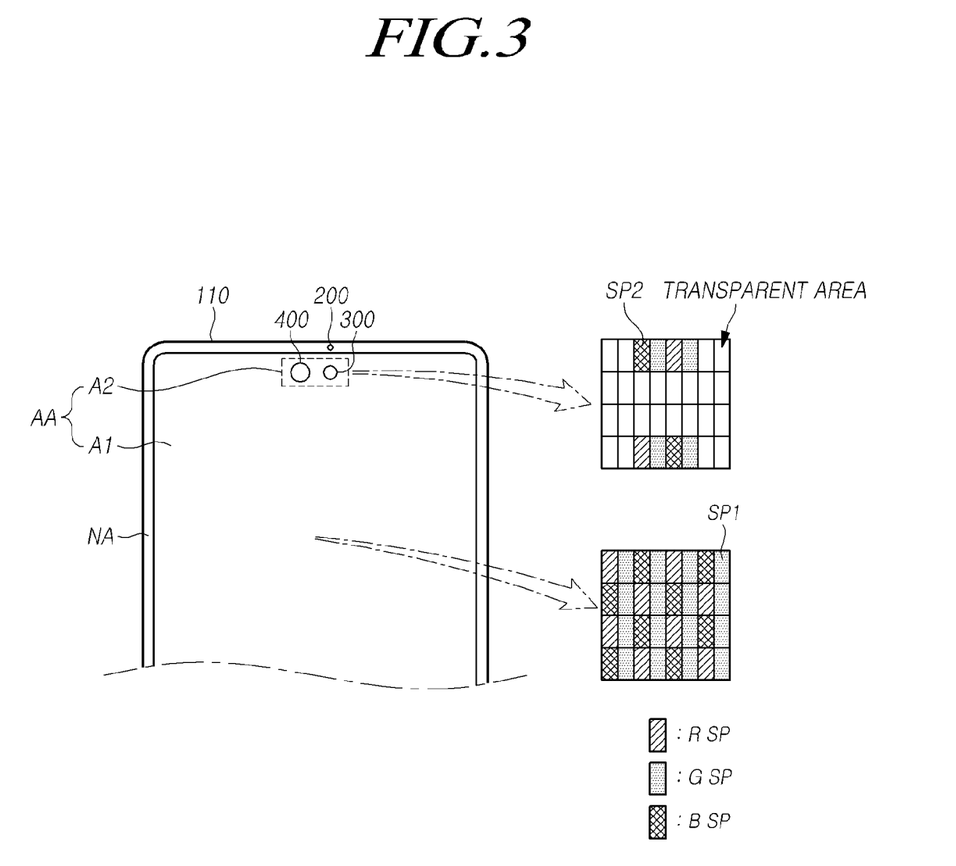
FIG. 3 is a diagram illustrating an example of a structure in which an optical sensor is provided in a display panel according to embodiments of the present disclosure.

FIG. 3 is a diagram illustrating an example of a structure in which an optical sensor is provided in the display panel 110 according to embodiments of the present disclosure.

Referring to FIG. 3, the active area AA of the display panel 110 includes a first area A1 with a first resolution and a second area A2 with a second resolution which is lower than the first resolution and which is other than the first area A1.

The first area A1 occupies most of the active area AA. The second area A2 is a partial area other than the first area A1 in the active area AA and is located outside of the active area AA and close to the non-active area NA.

Since the first resolution of the first area A1 is higher than the second resolution of the second area A2, a gap between first subpixels SP1 which are provided in the first area A1 and includes the light emitting element ED and circuit elements is smaller than a gap between second subpixels SP2 which are provided in the second area A2 and includes the light emitting element ED and circuit elements.

Alternatively, the gap between the subpixels SP may not be constant. In this case, the number of first subpixels SP1 which are provided per unit area in the first area A1 can be greater than the number of second subpixels SP2 which are provided per unit area in the second area A2.

Accordingly, the area or proportion of a transparent area in which no light emitting element ED and no circuit element are provided in the second area A2 can be greater than that in the first area A1. Since the proportion of the transparent area in the second area A2 is higher than the proportion of the transparent area in the first area A2, the transmittance of the second area A2 is higher than the transmittance of the first area A1.

Here, an optical sensor can be located in an area overlapping the second area A2 with high transmittance.

For example, the optical sensor can be provided on the back surface of the display panel 110 and can be located in an area overlapping the second area A2 of the active area AA.

That is, the optical sensor can be located in an area overlapping the active area AA.

Since the optical sensor is provided to overlap the second area A2 with high transmittance in the active area AA, light which is incident from the outside can be sensed by the optical sensor.

Accordingly, it is possible to curb a decrease in area of the active area AA or an increase in area of the non-active area NA and to provide the optical sensor in the display panel 110.

At this time, when the optical sensor includes a structure for emitting light and the structure for emitting light is located to overlap the active area AA, it can affect an image which is displayed through the active area AA.

Therefore, a structure for sensing light out of configurations of the optical sensor can be provided to overlap the active area AA and the structure for emitting light can be provided in an area other than the area overlapping the active area AA.

For example, a light emitting portion 200 is provided in the non-active area NA of the display panel 110 and a light receiving portion 300 is provided in the second area A2 of the active area AA. The light emitting portion 200 can emit infrared light which is different from light emitted from the light emitting elements ED in the subpixels SP of the display panel 110.

The light emitting portion 200 and the light receiving portion 300 constitute a proximity sensor or a gesture sensor.

An image sensor 400 such as a camera not including the structure for emitting light can be further provided in the second area A2 of the active area AA.

Since the light emitting portion 200 constituting a proximity sensor or gesture sensor is provided in the non-active area NA, the light emitting portion 200 can emit light for sensing without affecting an image which is displayed in the active area AA.

Since the light receiving portion 300 constituting a proximity sensor or a gesture sensor is provided in the second area A2 with high transmittance in the active area AA, the light receiving portion 300 can sense light which is emitted from the light emitting portion 200 and reflected by an object or the like.

Accordingly, in the display panel 110, it is possible to minimize an increase in area of the active area AA due to provision of a proximity sensor or a gesture sensor and to realize a proximity sensing function or a gesture sensing function.

Since external light can be sensed by the image sensor 400 which is provided in the second area A2 of the active area AA, the structure such as a camera can be provided to overlap an area in which an image is displayed in the display panel 110.

Accordingly, it is possible to prevent an increase in area of the non-active area NA due to provision of the image sensor 400 such as a camera and to provide a merit that a predetermined area (for example, a notch or a hole) may not be formed in the active area AA.

In the example illustrated in FIG. 3, the light receiving portion 300 constituting a gesture sensor and the image sensor 400 such as a camera are provided to be close to each other, but the active area AA can include two or more second areas A2 in some cases.

That is, only the light receiving portion 300 can be provided in one second area A2 located close to the light emitting portion 200 provided in the non-active area NA and the image sensor 400 can be provided in another second area A2 separated from the area in which the light receiving portion 300 is provided.

In this way, according to embodiments of the present disclosure, the light receiving portion 300 constituting a gesture sensor or the image sensor 400 such as a camera can be provided to overlap the active area by decreasing the resolution of a partial area of the active area AA of the display panel 110 and increasing the transmittance thereof.

Accordingly, it is possible to prevent a decrease in area or a change in shape of the active area AA due to provision of the optical sensor and to realize an optical sensing function of the display device 100.

By providing the light emitting portion 200 in the non-active area NA of the display panel 110, it is possible to realize the optical sensing function without affecting an image display function of the active area AA.

According to embodiments of the present disclosure, it is possible to provide technology of providing the light emitting portion 200 in a printed circuit provided in the non-active area NA in order to prevent an increase in area of the non-active area NA due to provision of the light emitting portion 200.

Figure 4:
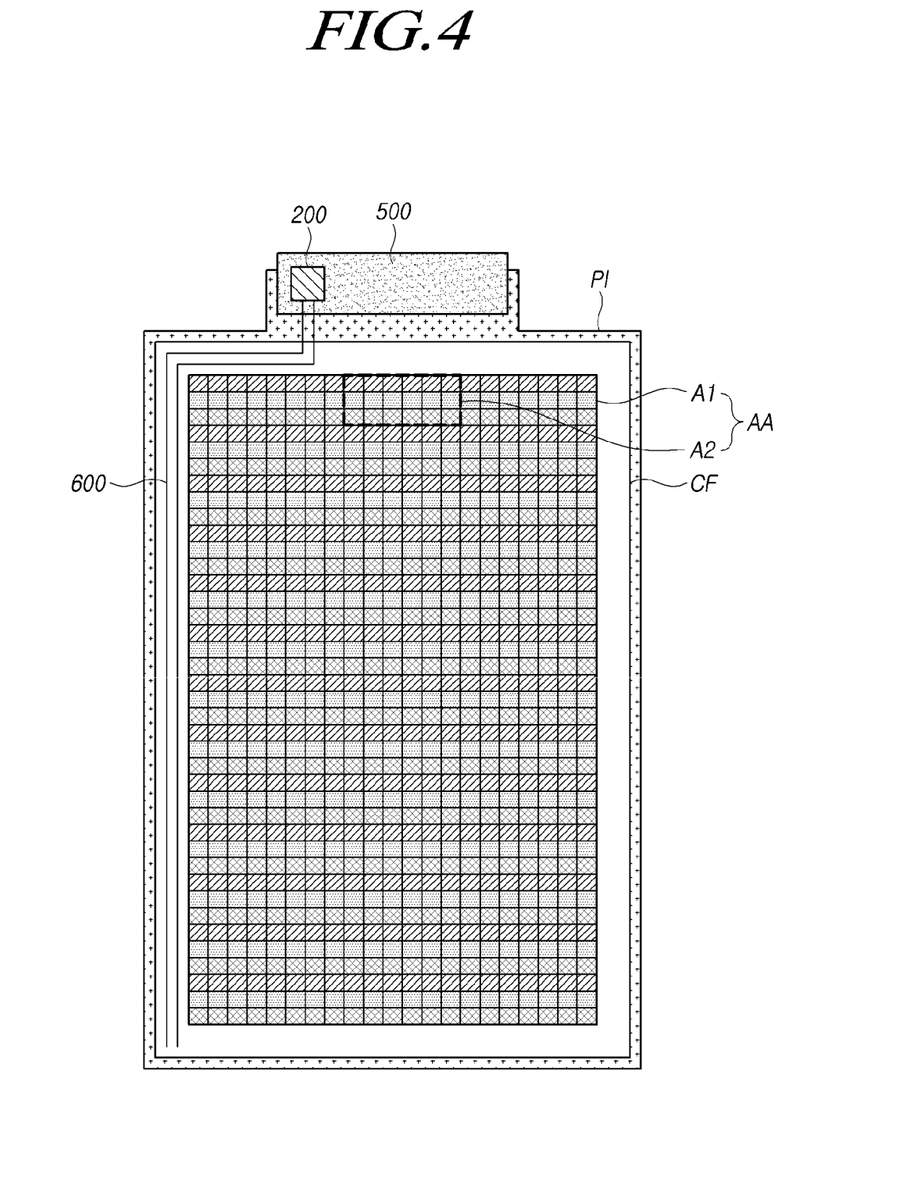
FIG. 4 is a diagram illustrating another example of the structure in which an optical sensor is provided in a display panel according to embodiments of the present disclosure.
Figure 5:
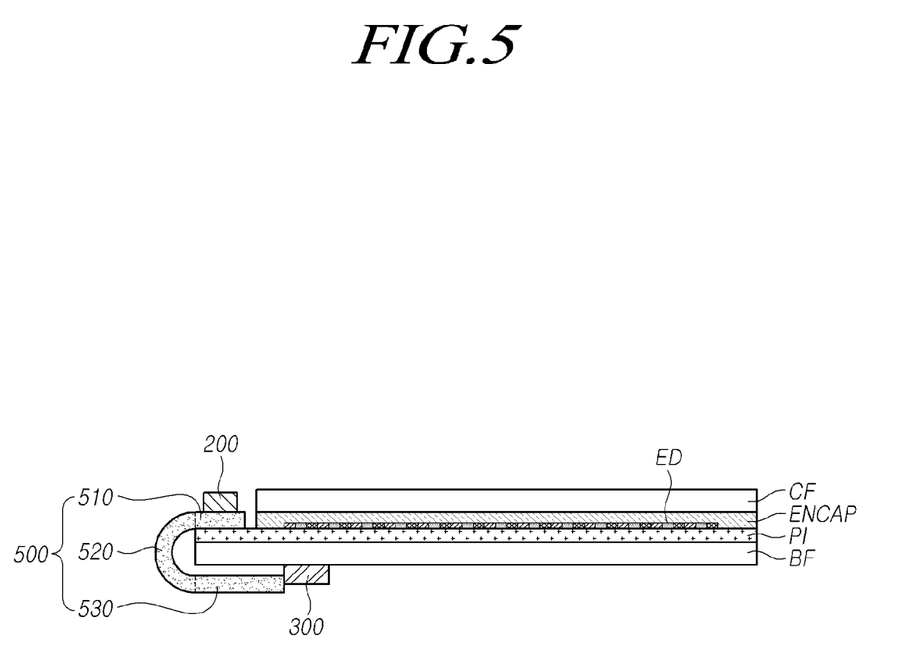
FIGS. 5 and 6 are diagrams schematically illustrating an example of a cross-sectional structure of the display panel illustrated in FIG. 4.

FIG. 4 is a diagram illustrating another example of the structure in which an optical sensor is provided in the display panel 110 according to embodiments of the present disclosure. FIG. 5 is a diagram illustrating an example of a cross-sectional structure of the display panel 110 illustrated in FIG. 4.

Referring to FIGS. 4 and 5, the display panel 110 includes a polyimide substrate PI (base substrate), a light emitting element ED which is located on the polyimide substrate PI, and an encapsulation portion ENCAP which is located on the light emitting element ED.

A polarizing film, a cover film CF, or the like can be provided on the encapsulation portion ENCAP. A back film BF or the like can be provided on the back surface of the polyimide substrate PI.

Here, a flexible printed circuit 500 on which a driving circuit and the like are mounted can be bonded to the non-active area NA of the display panel 110. For example, the data driving circuit 130 can be mounted on the flexible printed circuit 500.

The light emitting portion 200 constituting a gesture sensor or the like can be provided in a partial area in which a driving circuit, a signal line, and the like are not provided on the flexible printed circuit 500.

The light emitting portion 200 can be provided in an area in which the flexible printed circuit 500 and the non-active area NA overlap each other and can be located in an area other than the area overlapping the active area AA.

For example, the flexible printed circuit 500 includes a first part 510 that is located in the non-active area NA, a second part 520 that is connected to the first part 510 and is bent to the back surface of the display panel 110, and a third part 530 that is connected to the second part 520 and is located on the back surface of the display panel 110.

The light emitting portion 200 is provided on the top surface of the first part 510 of the flexible printed circuit 500.

The light receiving portion 300 constituting a gesture sensor or the like along with the light emitting portion 200 is located on the back surface of the display panel 110 and is located in an area overlapping the active area AA.

The light receiving portion 300 is located in an area overlapping the second area A2 out of the first area A1 and the second area A2 of the active area AA.

The light receiving portion 300 is located under the back film BF of the display panel 110, but can be located on the back film BF or can be located in an area in which the back film BF is partially removed.

A light source power supply line 600 that supplies electric power to the light emitting portion 200 is provided in the non-active area NA of the display panel 110. Alternatively, the light source power supply line 600 can be provided on one surface of the flexible printed circuit 500 on which the light emitting portion 200 is provided.

In this way, since the light emitting portion 200 constituting a gesture sensor or the like is provided on the flexible printed circuit 500 provided in the non-active area NA of the display panel 110, it is possible to prevent an increase in area of the non-active area NA due provision of the light emitting portion 200.

That is, the flexible printed circuit 500 is necessary for provision of a driving circuit, a signal line, or the like for supplying a signal or a voltage to the subpixels SP provided in the display panel 110. Since the light emitting portion 200 is provided in a partial area on the flexible printed circuit 500, an additional area for providing the light emitting portion 200 may not be required for the non-active area NA.

Since the light receiving portion 300 is located on the back surface of the display panel 110 and located in an area overlapping the active area AA, a decrease in area of the active area AA or an increase in area of the non-active area NA due to provision of the light receiving portion 300 is not required.

Since the light receiving portion 300 is located in an area overlapping the second area A2 with a low resolution and high transmittance, light which is emitted from the light emitting portion 200 and reflected by an object can be sensed by the light receiving portion 300.

Accordingly, it is possible to realize a gesture sensing function by providing an optical sensor in the display panel 110 without changing the areas, shapes, or the like of the active area AA and the non-active area NA in the display panel 110.

Alternatively, the light receiving portion 300 constituting a gesture sensor or the like can be located on the back surface of the display panel 110 and on a partial area of the flexible printed circuit 500.

Figure 6:
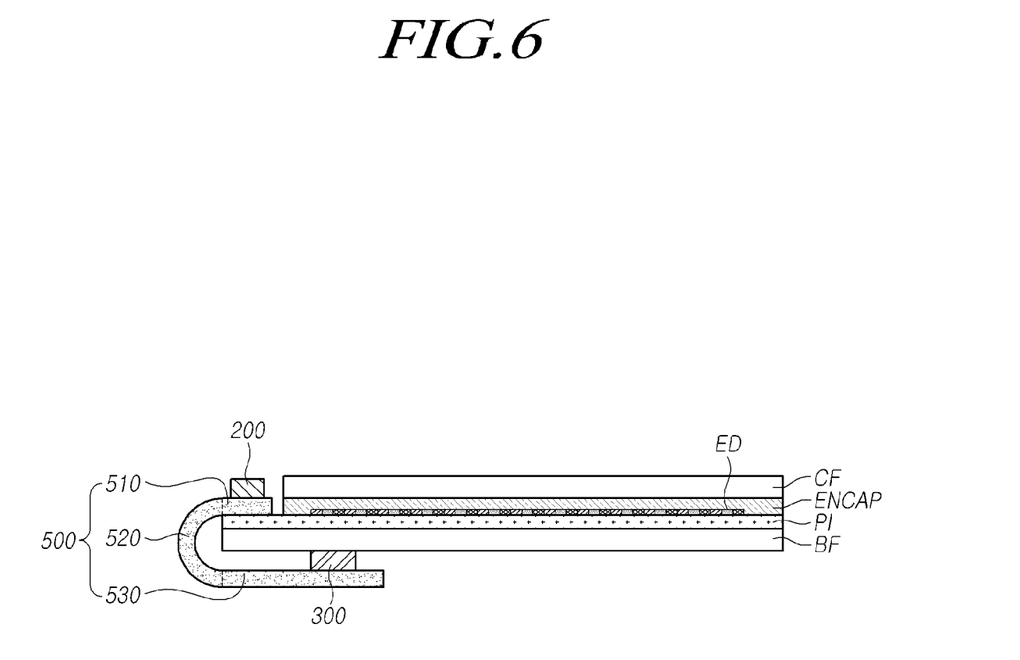

FIG. 6 is a diagram schematically illustrating another example of the cross-sectional structure of the display panel 110 illustrated in FIG. 4.

Referring to FIGS. 4 and 6, a plurality of light emitting elements ED for displaying an image are provided in the active area AA of the display panel 110.

The flexible printed circuit 500 in which a driving circuit and the like are provided is bonded to the non-active area NA of the display panel 110. The light emitting portion 200 is provided in a partial area on the flexible printed circuit 500.

The light receiving portion 300 constituting a gesture sensor or the like along with the light emitting portion 200 is provided on the back surface of the display panel 110. The light receiving portion 300 is located in an area overlapping the active area AA and is provided to overlap the second area A2 with high transmittance.

The light receiving portion 300 can be provided on the flexible printed circuit 500 which is located on the back surface of the display panel 110.

For example, the light emitting portion 200 can be provided on a first surface of the first part 510 of the flexible printed circuit 500. The light receiving portion 300 can be provided on a second surface opposite to the first surface in the third part 530 of the flexible printed circuit 500.

Since the flexible printed circuit 500 is provided to surround one side surfaces of the display panel 110 and the third part 530 of the flexible printed circuit 500 is located on the back surface of the display panel 110, the light receiving portion 300 can be located on one surface of the flexible printed circuit 500 when wiring patterns are printed on both surfaces of the flexible printed circuit 500.

That is, the light emitting portion 200 provided in the non-active area NA and the light receiving portion 300 provided in the active area AA can be located on both surfaces of the flexible printed circuit 500.

Accordingly, by bonding the flexible printed circuit 500 on which the light emitting portion 200 and the light receiving portion 300 are provided to the non-active area NA of the display panel 110, the light emitting portion 200 and the light receiving portion 300 constituting a gesture sensor or the like can be easily provided in the display panel 110.

Then, the light emitting portion 200 and the like can be easily provided in the display panel 110 by previously attaching the light emitting portion 200 and the like to the flexible printed circuit 500 and then connecting the flexible printed circuit 500 to the display panel 110.

Figure 7:
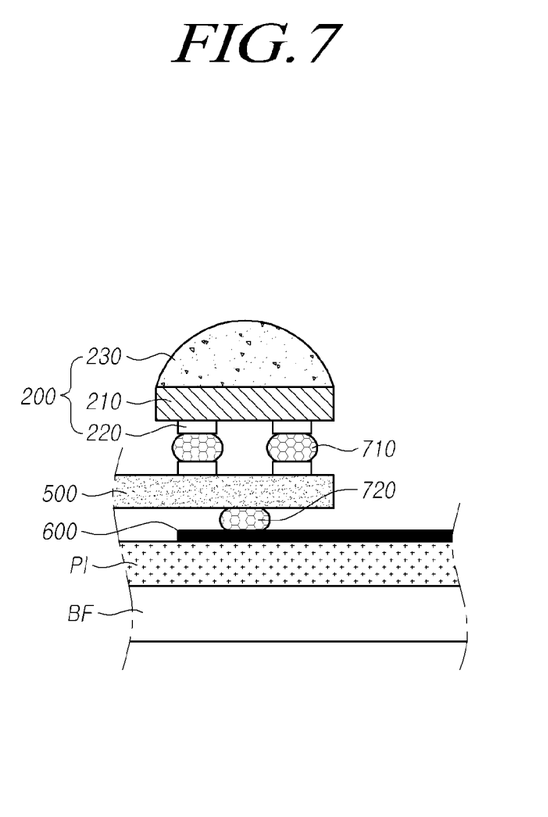
FIG. 7 is a diagram illustrating an example of a structure in which a light emitting portion of the optical sensor illustrated in FIG. 4 is provided.
Figure 8:
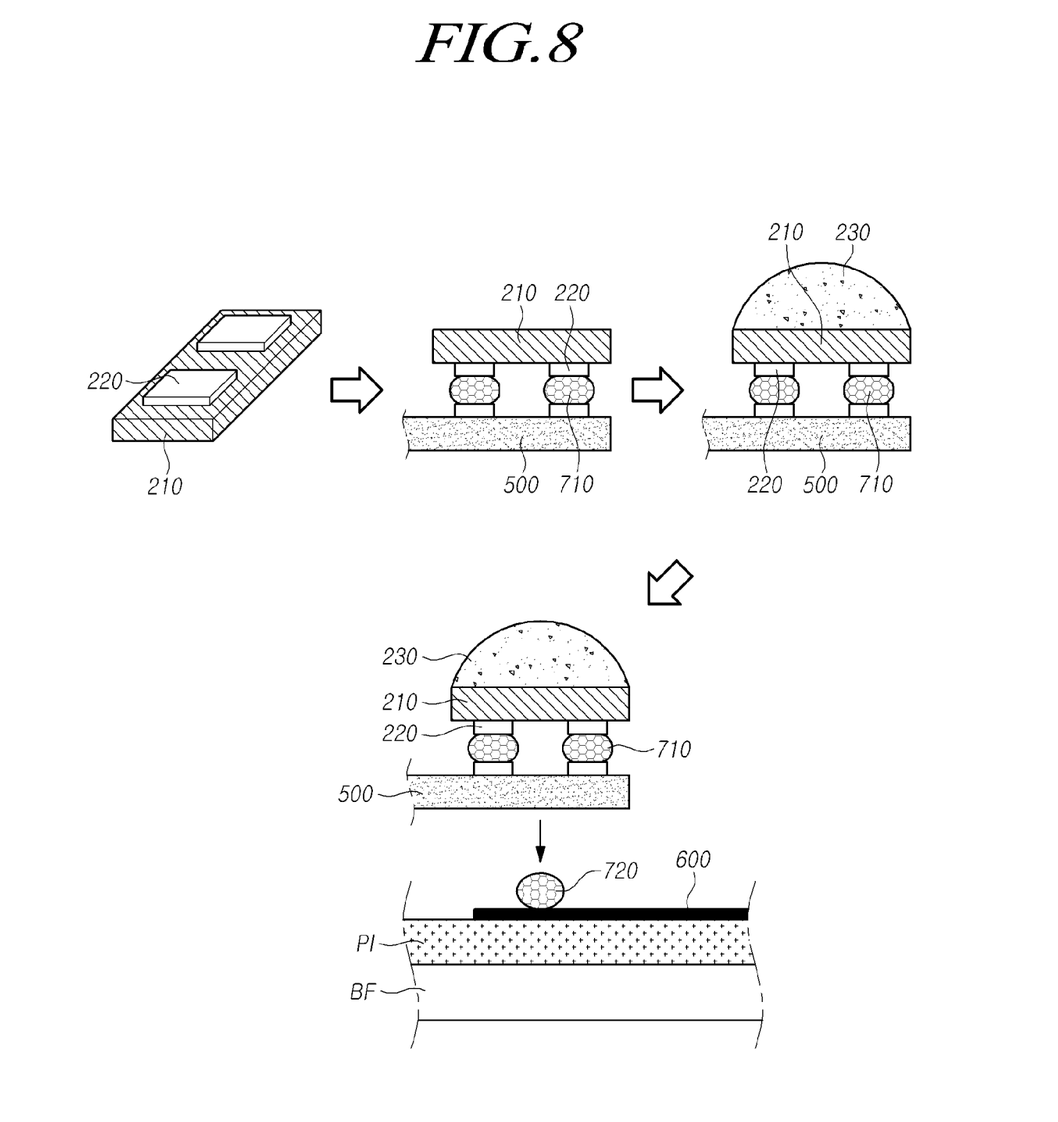
FIG. 8 is a diagram illustrating an example of a process of providing the light emitting portion of the optical sensor illustrated in FIG. 4.

FIG. 7 is a diagram illustrating an example of a structure in which the light emitting portion 200 of the optical sensor illustrated in FIG. 4 is provided. FIG. 8 is a diagram illustrating an example of a process of providing the light emitting portion 200 of the optical sensor illustrated in FIG. 4.

Referring to FIG. 7, the light emitting portion 200 includes a light source 210 that emits infrared light, an electrode portion 220 that supplies electric power to the light source 210, and a protective member 230 that is provided on the light source 210.

The light source 210 emits infrared light for proximity sensing or gesture sensing and can be, for example, of a flip chip type.

The electrode portion 220 is attached to the light source 210 and is electrically connected to the flexible printed circuit 500 by a first adhesive member 710. Electric power which is supplied from a light source power supply line 600 which is electrically connected to the flexible printed circuit 500 by a second adhesive member 720 can be transmitted to the light source 210 via the electrode portion 220.

The protective member 230 is formed of, for example, epoxy and is provided on the light source 210 to protect the light source 210 and to serve as a finishing material. The protective member 230 can be provided in a convex shape and provide a lens function.

The light emitting portion 200 can be provided in a state in which the flexible printed circuit 500 is bonded to the polyimide substrate PI of the display panel 110, or can be bonded to the flexible printed circuit 500 in a state in which the light emitting portion 200 is previously attached to the flexible printed circuit 500 for the purpose of convenience of a process.

Referring to FIG. 8, the electrode portion 220 is provided on the light source 210 of a flip chip type. Then, the light source 210 in which the electrode portion 220 is provided is inverted and is attached onto the flexible printed circuit 500.

When the light source 210 is completely provided on the flexible printed circuit 500, the protective member 230 is provided on the light source 210.

In this way, by bonding the flexible printed circuit 500 onto the polyimide substrate PI in a state in which the light emitting portion 200 is completely provided on the flexible printed circuit 500, the light emitting portion 200 provided on the flexible printed circuit 500 is located in the non-active area NA of the display panel 110.

Here, the light source power supply line 600 that supplies electric power to the light emitting portion 200 can be patterned on the polyimide substrate PI in advance.

Alternatively, the light source power supply line 600 can be patterned on one surface of the flexible printed circuit 500.

In this case, the light emitting portion 200 and the structure for supplying electric power to the light emitting portion 200 can be located in the flexible printed circuit 500 and only the light receiving portion 300 can be located on the back surface of the display panel 110.

Alternatively, as described above, in a state in which the light emitting portion 200 and the light receiving portion 300 are provided on both surfaces of the flexible printed circuit 500, the flexible printed circuit 500 can be bonded to the non-active area NA of the display panel 110 and thus the light emitting portion 200 and the light receiving portion 300 can be provided.

In this way, according to embodiments of the present disclosure, an optical sensor can be provided without requiring a decrease in area or a change in shape of the active area AA by forming a low-resolution area in the active area AA of the display panel 110 and providing the optical sensor on the back surface of the display panel 110 overlapping the low-resolution area.

By providing the optical sensor in an area with high transmittance, it is possible to realize a sensing function using the optical sensor located in an area overlapping the active area AA.

By providing the light emitting portion 200 constituting a proximity sensor, a gesture sensor, or the like in the non-active area NA, it is possible to prevent an influence of light emitted from the light emitting portion 200 on display driving and to provide a gesture sensor or the like in the display panel 110.

By bonding the flexible printed circuit 500 in the non-active area NA in a state in which the light emitting portion 200 is provided in advance in a partial area in which a driving circuit, a signal line, and the like are not provided on the flexible printed circuit 500 bonded to the non-active area NA of the display panel 110, it is possible to easily provide a gesture sensor or the like in the display panel 110 without increasing the area of the non-active area NA due to provision of the light emitting portion 200.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present disclosure.

The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device comprising:
a display panel that includes an active area in which a plurality of subpixels are arranged on a base substrate and a non-active area which is located outside of the active area, wherein the base substrate of the display panel extends into the non-active area;
a flexible printed circuit that is flexibly bent to wrap around an edge portion of the base substrate in the non-active area, the flexible printed circuit including a first part provided on the base substrate in the non-active area;
at least one light emitting portion that is provided on the first part of the flexible printed circuit;
at least one light receiving portion that is located on a back surface of the display panel and is provided in an area overlapping the active area,
wherein a top surface of the at least one light emitting portion provided on the first part of the flexible printed circuit is positioned higher than a top surface of the display panel; and
an encapsulation layer disposed in the active area and having a top surface extending substantially coplanar with a top surface of the first part of the flexible printed circuit on which the at least one light emitting portion is provided.

2. The display device according to claim 1, wherein the at least one light emitting portion includes:
a light source that is attached onto the flexible printed circuit; and
a protective member that is provided on the light source and has a convex shape.

3. The display device according to claim 1, wherein the at least one light emitting portion is located in an area in which the flexible printed circuit and the non-active area overlap each other.

4. The display device according to claim 1, wherein the at least one light emitting portion is located in an area other than an area overlapping the active area.

5. The display device according to claim 1, wherein the flexible printed circuit further includes:
a second part that is connected to the first part and is flexible bent to wrap around the edge portion of the base substrate, and
a third part that is connected to the second part and is located on the back surface of the display panel, and
wherein the at least one light emitting portion is provided on a first surface of the first part of the flexible printed circuit.

6. The display device according to claim 5, wherein the at least one light receiving portion is located on a second surface opposite to the first surface in the third part of the flexible printed circuit, so that the at least one light emitting portion and the at least one receiving portion are provided respectively on top and bottom surfaces of the flexible printed circuit.

7. The display device according to claim 1, wherein the active area includes a first area with a first resolution and a second area with a second resolution which is lower than the first resolution,
wherein the at least one light receiving portion is located in an area overlapping the second area, and
wherein the second area is located adjacent to the non-active area in an edge of the active area between the first area and the non-active area.

8. The display device according to claim 1, further comprising:
a light emitting element provided on the base substrate in each of the plurality of subpixels in the active area, and being part of the display panel,
wherein the encapsulation layer is provided on the light emitting element in the active area, and is part of the display panel; and
a back film provided below the base substrate and extending in the active area and the non-active area,
wherein the at least one light receiving portion is provided below the back film in the active area.

9. The display device according to claim 1, wherein the at least one light emitting portion emits light and the at least one light receiving portion senses light which is formed by causing the light emitted from the at least one light emitting portion to be reflected by an object in at least a partial period of a period in which an image is displayed through the active area.

10. A display device comprising:
a substrate that includes an active area and a non-active area which is located outside of the active area;
a plurality of light emitting elements that are arranged in the active area on the substrate;
at least one light emitting portion that is provided on a part of a flexible printed circuit bonded to the non-active area of the substrate and emits light of a wavelength different from a wavelength of light emitted from the plurality of light emitting elements;
an encapsulation layer covering the plurality of light emitting elements, and having a top surface extending substantially coplanar with a top surface of the part of the flexible printed circuit on which the at least one light emitting portion is provided; and
at least one light receiving portion that is located in an area other than an area overlapping the at least one light emitting portion,
wherein a top surface of the at least one light emitting portion provided on the part of the flexible printed circuit is positioned higher than a top surface of the encapsulation layer.

11. The display device according to claim 10, wherein the at least one light receiving portion is located under the substrate and is located in an area overlapping the active area.

12. The display device according to claim 10, wherein the active area includes a first area and a second area in which the number of light emitting elements provided per unit area is less than that of the first area, and
wherein the at least one light receiving portion is located in an area overlapping the second area.

13. The display device according to claim 12, further comprising:
an image sensor that is located under the substrate, is located in an area other than an area in which the at least one light receiving portion is provided in the area overlapping the second area, and senses light of a wavelength different from a wavelength of the light emitted from the at least one light emitting portion.

14. The display device according to claim 10, wherein the at least one light emitting portion emits light in at least a partial period of a period in which at least one light emitting element out of the plurality of light emitting elements emits light.

15. A display device comprising:
- a display panel that includes an active area in which a plurality of subpixels are arranged on a base substrate and a non-active area which is located outside of the active area, wherein the base substrate of the display panel extends into the non-active area;
- a first area included in the active area, and having a first resolution;
- a second area included in the active area, and having a second resolution which is lower than the first resolution;
- at least one optical sensor located on a back surface of the display panel and overlapped with the second area;
- at least one flexible printed circuit that is disposed on the base substrate in the non-active area;
- at least one light emitting portion located on a top surface of the at least one flexible printed circuit in the non-active area;
- an encapsulation layer disposed in the active area and having a top surface extending substantially coplanar with the top surface of the flexible printed circuit on which the at least one light emitting portion is provided,
- wherein a top surface of the at least one light emitting portion provided on the top surface of the at least one flexible printed circuit is positioned higher than a top surface of the display panel; and
- a back film provided below the base substrate and extending in the active area and the non-active area,
- wherein the base substrate and the back film are disposed below the at least one flexible printed circuit in the non-active area, and
- wherein a top surface of the at least one optical sensor contacts at least a portion of a bottom surface of the back film.

16. The display device according to claim 15, wherein the at least one optical sensor is located on one surface of the at least on flexible printed circuit.

17. The display device according to claim 15, wherein the at least one flexible printed circuit includes a first part that is provided in the non-active area, a second part that is connected to the first part and is bent, and a third part that is connected to the second part and is located on the back surface of the display panel, and
- the at least one optical sensor is located on one surface of the third part of the at least one flexible printed circuit.

18. The display device according to claim 15, wherein the at least one light emitting portion emits light of a wavelength different from a wavelength of light emitted from a light emitting element disposed in each of the plurality of sub-pixels.

19. The display device according to claim 18, wherein the light emitting element disposed in each of the plurality of sub-pixels includes an organic light emitting diode, a light emitting diode, a micro light emitting diode, or quantum dots.

20. The display device according to claim 15, wherein the entire at least one optical sensor is disposed inside a side edge of the display panel, so that the at least one optical sensor and the display panel are not aligned.

* * * * *